United States Patent
Araki et al.

[11] Patent Number: 5,796,669
[45] Date of Patent: Aug. 18, 1998

[54] SYNCHRONOUS SEMICONDUCTOR MEMORY DEVICE

[75] Inventors: Takashi Araki; Hisashi Iwamoto; Yasuhiro Konishi, all of Tokyo, Japan

[73] Assignee: Mitsubishi Denki Kabushiki Kaisha, Tokyo, Japan

[21] Appl. No.: 900,123

[22] Filed: Jul. 25, 1997

[30] Foreign Application Priority Data

Mar. 3, 1997 [JP] Japan ................ 9-047910

[51] Int. Cl.$^6$ ............................ G11C 7/00
[52] U.S. Cl. ............ 365/222; 365/230.03; 365/233
[58] Field of Search ................ 365/222, 233, 365/230.03, 236, 230.04

[56] References Cited

U.S. PATENT DOCUMENTS 5,384,745  1/1995  Konishi et al. ............ 365/230.03
5,535,169  7/1996  Endo et al. ................ 365/230.03
5,598,372  1/1997  Matsumoto et al. ........ 365/222 X

FOREIGN PATENT DOCUMENTS 7-226077  8/1995  Japan .

*Primary Examiner*—Son Mai
*Attorney, Agent, or Firm*—Oblon, Spivak, McClelland, Maier & Neustadt, P.C.

[57] ABSTRACT

Switches (11, 12) select either of refresh address counters (6a, 6b) in accordance with a refresh bank set signal (φREFADD) when a bank refresh signal (φBANKREF) is activated. An internal bank address (int.BA) serves as the refresh bank set signal (φREFADD) to control the switch (12) and the refresh address counter (6a or 6b) designated by the internal bank address (int.BA) performs a count operation in synchronization with a refresh clock (φREFCLK). The switch (11) outputs either of refresh addresses (Ref.Add_A<0:10>, Ref.Add_B<0:10>) which is updated. With this configuration provided is an SDRAM which allows access to data during a refresh operation.

13 Claims, 14 Drawing Sheets

SYNCHRONOUS SEMICONDUCTOR MEMORY DEVICE

BACKGROUND OF THE INVENTION

1. Field of the Invention

The present invention relates to a semiconductor memory device, and more particularly to a refreshing technique for a synchronous dynamic RAM (SDRAM).

2. Description of the Background Art

Though an operating speed of a dynamic RAM (DRAM) used as a main memory has been improved, yet it can not catch up with that of a microprocessor (MPU). Therefore, it is often said that the slow access time and cycle time of the DRAM should be a bottleneck in improving performance of an entire system. Then, in recent, an SDRAM which operates in synchronization with a clock signal has been proposed as a main memory for a high-speed MPU.

A normal operation of an SDRAM is illustrated in timing charts of FIGS. 12A to 12H. Eight-bit (1-byte)) data are inputted to each of eight data input/output terminals DQ successively, in synchronization with a system clock signal. Accordingly, data of 64 bits (8×8) are written into/read from the SDRAM at high speed.

At a rising edge of an externally-received clock signal CLK serving as a system clock, externally-received control signals such as a chip select signal /CS ("/" represents the logic inversion), a row address strobe signal /RAS, a column address strobe signal /CAS, a write enable signal /WE, an address signal Add and a bank address signal BA are inputted to the SDRAM.

The address signal Add consists of time-division multiplexed row address signal X and column address signal Y. At a rising edge of the clock signal CLK, when the chip select signal /CS and the row address strobe signal /RAS are "L" of active state and the column address strobe signal /CAS and the write enable signal /WE are "H" of non-active state, the address signal Add is recognized as the row address signal X.

At another rising edge of the clock signal CLK, when the chip select signal /CS and the column address strobe signal /CAS are "L" of active state and the row address strobe signal /RAS is "H" of non-active state, the address signal Add is recognized as the column address signal Y. At this time, a write is performed if the write enable signal /WE is "L" and a read is performed if the write enable signal /WE is "H".

According to FIGS. 12A and 12F, a row address signal Xa is inputted to the SDRAM as the address signal Add at the rising edge of time t11 and a column address signal Yb is inputted at the rising edge of time t12.

In response to the row address signal Xa and the column address signal Yb, selections of row and column are performed in the SDRAM, and a /CAS latency time (for 3 clock cycles in FIG. 12H) exists until time t13. Since the write enable signal /WE is "H" at time t12, 8-bit data (e.g., b0 to b7) are sequentially read out from the SDRAM by each of the data input/output terminals DQ in response to each rise of the clock signal CLK from time t13 on. The number of bits to be successively read is termed a burst length, and the burst length of FIG. 12H is eight.

A precharge is performed at time t14, and a row address signal Xc is inputted to the SDRAM at time t15 and a column address signal Yd is inputted at time t16. Since the write enable signal /WE is "L" at time t16, 8-bit data (d0 to d7) are sequentially written into the SDRAM by each of the data input/output terminals DQ in response to each rise of the clock signal CLK from time t16 on.

Furthermore, the SDRAM adopts a concept of a plurality of banks. Specifically, it is assumed that an internal memory array is divided into a plurality of banks and each bank is activated (to rise a word line and operate a sense amplifier) and precharged almost independently.

For example, the timing charts of FIGS. 12A to 12H show the operation of one of two banks constituting an SDRAM. Specifically describing, it can be seen from the bank address BA of FIG. 12G, becoming "L" at times t11, t12, t14, t15 and t16, that designation of the row and column addresses and a precharge are performed for one of two banks.

For DRAM inclusive of SDRAM, in general, a precharge is needed before access (read/write). That results in the cycle time almost twice as much as the access time. In a configuration of DRAM internally-divided into a plurality of banks, however, access is made to a bank BANK0 while the other bank Bank1 is precharged. Therefore, access can be made to the bank Bank1 without taking additional time for precharge.

Thus, it becomes possible to eliminate a loss time due to precharge by alternate access/precharge operations for a plurality of banks. That is, an interleave method, which has been conventionally adopted outside the DRAM, is introduced to the inside of the DRAM.

The refresh mode of the SDRAM includes an auto-refresh mode and a self-refresh mode. The auto-refresh mode generates a refresh address by using an internal refresh counter, activates a word line and a sense amplifier and then automatically makes the word line precharged. On the other hand, the self-refresh mode periodically repeats the same operation as the auto-refresh mode automatically by using an internal timer.

The auto-refresh operation of the SDRAM is shown in the timing charts of FIGS. 13A to 13I. At a rising edge of the clock signal CLK, if the chip select signal /CS is "L", the row address strobe signal /RAS is "L", the column address strobe signal /CAS is "L", the write enable signal /WE is "H" and a clock enable signal CKE is "H", the auto-refresh is performed. A command with the above signals ("auto-refresh command") permits a row of memory cells to be automatically refreshed in about 100 ns. In order to refresh 4096 rows of memory cells, it is necessary to repeat this auto-refresh 4096 times.

The self-refresh operation of the SDRAM is shown in the timing charts of FIGS. 14A to 14I. At a rising edge of the clock signal CLK, if the chip select signal /CS is "L", the row address strobe signal /RAS is "L", the column address strobe signal /CAS is "L", the write enable signal /WE is "H" and the clock enable signal CKE is "L", the self-refresh is performed. Being started, the self-refresh mode continues performing an internal refresh operation until the clock enable signal CKE becomes "H".

A schematic configuration of a control unit of the SDRAM is shown in the block diagram of FIG. 15. A clock buffer 2 buffers an externally-supplied clock signal ext.CLK and generates an internal clock int.CLK to be supplied for each circuit.

A circuit 101 including a control-signal buffer and a command decoder outputs an operation signal φNORMAL, a refresh signal φREF, an activation signal φACT and the like in accordance with a combination of the control signals. Receiving the refresh signal φREF and the activation signal φACT, a memory-array control circuit 5 controls a memory array not shown.

On the other hand, an address buffer 3 and a bank-address buffer 4 buffer the address signal Add<0:10> and the bank address BA both of which are externally received and outputs the signals as an internal address signal int.Add <0:10> and an internal bank address int.BA in synchronization with the internal clock int.CLK, respectively.

Switches 121 and 122 are controlled by the operation signal φNORMAL which is activated in a normal operation, and the internal address signal int.Add<0:10> and the internal bank address int.BA are outputted to the memory array not shown.

During the refresh operation, the refresh signal φREF is activated. A refresh address counter 6 updates its output every time the refresh signal φREF is activated and the updated output is provided as a refresh address signal Ref_Add <0:11> through switches 123 and 124. The refresh address signal Ref_Add <0:11> consists of a refresh row signal Ref_Add<0:10> indicating a row address and a refresh bank signal Ref_Add<11> designating a bank.

A configuration of the refresh address counter 6 is shown in the block diagram of FIG. 16. In accordance with the transition of a refresh clock φREFCLK, a bank-address counter counts to obtain the refresh bank signal Ref_Add <11> and an address counter frequency-divides the output of the bank-address counter by half one after another to sequentially obtain refresh signals Ref_Add <0>, Ref_Add<1>, . . . , Ref_Add<10>.

During the self-refresh operation, a self-refresh signal φSREF is activated as well as the refresh signal φREF, and a self-refresh timer 7 thereby generates a continuation signal φTIMER.

The self-refresh operation for the SDRAM consisting of two banks Bank0 and Bank1 is shown in the conceptional diagram of FIG. 17. The refresh operation is performed on a row designated by the refresh row signal Ref_Add<0:10> in a bank designated by the refresh-bank signal Ref_Add<11>.

As can be seen from FIG. 16, since the refresh-bank signal Ref_Add<11> is first updated among the refresh address signals Ref_Add<0> to<11>, the two banks are alternately activated to be refreshed.

Thus, even in the SDRAM consisting of two banks, the refresh address counter 6 generates the refresh address signal Ref_Add<0:11> to alternately activate the two banks and accordingly the two banks can not operate independently of each other during the refresh operation. In other words, the problem that no access can be made to data during the refresh operation is still unsolved. Therefore, the problem still remains that a system employing a DRAM, inclusive of an SDRAM, has lower performance than that employing an SRAM which needs not be refreshed.

SUMMARY OF THE INVENTION

The present invention is directed to a synchronous semiconductor memory device. According to a first aspect of the present invention, the synchronous semiconductor memory device comprises: a memory array including a plurality of bank groups each consisting of at least one bank, and the synchronous semiconductor memory device further comprises: (a) refresh address counters provided correspondingly to the plurality of bank groups; (b) a first switch receiving a first signal which is activated to indicate a refresh operation and a second signal which is activated to indicate a special refresh operation included in the refresh operation, and supplying a refresh clock to one of the refresh address counters by (b-1) changing a connection every time the first signal is activated when the second signal is not activated, or (b-2) determining the connection in accordance with a bank address for externally designating one of the plurality of bank groups when the second signal is activated, and (c) a second switch adopting an output from the one of the refresh address counters which is supplied with the refresh clock as a refresh address to be used for refreshing the memory array.

According to a second aspect of the present invention, the synchronous semiconductor memory device of the first aspect further comprises: (d) a latch circuit for latching the bank address at a mode set operation for defining an input/output operation on the memory array and outputting the bank address which is latched therein when the second signal is activated.

According to a third aspect of the present invention, the synchronous semiconductor memory device of the first aspect further comprises: (d) a latch circuit for latching the bank address of the bank to be precharged and outputting the bank address which is latched therein when the second signal is activated.

According to a fourth aspect of the present invention, in the synchronous semiconductor memory device of the first aspect, the at least one bank is a plurality of banks, and the bank address is the most significant bit of a plurality of bits designating one of the plurality of banks.

According to a fifth aspect of the present invention, the synchronous semiconductor memory device of any of the first to fourth aspects further comprises: a logic circuit for generating a busy signal to be used for ignoring an access request which is issued to one of the plurality of bank groups being refreshed during the special refresh operation.

Thus, according to the present invention, in an SDRAM consisting of a plurality of banks, a bank can be refreshed while another bank is accessed. Therefore, the present invention allows the SDRAM to be used like an SRAM which needs not be refreshed.

The synchronous semiconductor memory device of the first aspect enables two refresh operations, i.e., an ordinary refresh operation and a special refresh operation. In the ordinary refresh operation, the refresh address counters corresponding to the bank groups are alternately selected to update the refresh address every time, and therefore different bank groups can be alternately refreshed. In the special refresh operation, only the refresh counter corresponding to the designated bank group updates the refresh address, and therefore different rows in the designated bank group can be sequentially refreshed.

In the synchronous semiconductor memory device of the second aspect, designating a bank to be refreshed at the mode set eliminates the need for designating the bank address every time the special refresh operation is performed since the latch circuit holds the address of the bank designated at the mode set.

In the synchronous semiconductor memory device of the third aspect, since the latch circuit holds the address of the bank to be precharged as a bank to be refreshed, it is possible to eliminate the need for designating the bank address every time the special refresh operation is performed.

The synchronous semiconductor memory device of the fourth aspect needs only two refresh address counters, not as much as the banks. The plurality of banks in each bank group can be refreshed like in the background art.

The synchronous semiconductor memory device of the fifth aspect avoids a failure to perform a proper refresh operation and a proper write/read operation caused by accessing to the bank being refreshed.

An object of the present invention is to provide an SDRAM which allows data access even during a refresh operation.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
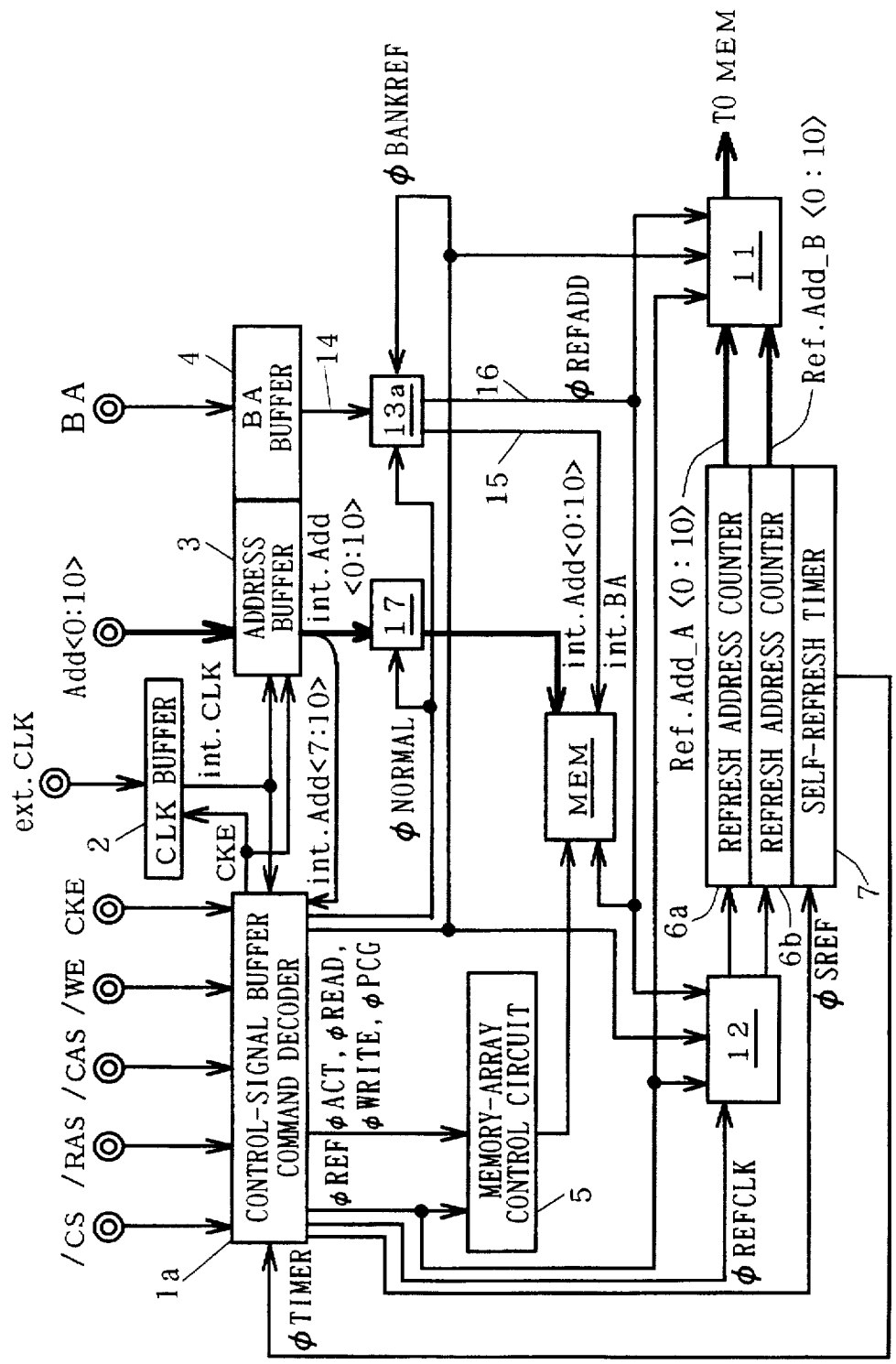
FIG. 1 is a block diagram showing a configuration of a control unit of an SDRAM in accordance with a first preferred embodiment of the present invention.

A configuration of a control unit of an SDRAM in accordance with the first preferred embodiment of the present invention is shown in the block diagram of FIG. 1. The SDRAM of this preferred embodiment comprises a memory array MEM consisting of two banks. The two banks can operate independently of each other as discussed earlier. Each bank includes, for example, 2048 ($2^{11}$) rows.

The clock buffer 2 buffers the externally-supplied clock signal ext.CLK and outputs the internal clock int.CLK. The address buffer 3 buffers the externally-received address signal Add<0:10> based on the internal clock int.CLK and outputs the internal address signal int.Add<0:10>. The bank-address buffer 4 buffers the externally-received bank address BA based on the internal clock int.CLK and outputs the internal bank address int.BA.

A circuit 1a includes the control-signal buffer and the command decoder and operates based on the internal clock int.CLK. The circuit 1a receives the chip select signal /CS, the row address strobe signal /RAS, the column address strobe signal /CAS, the write enable signal /WE and the clock enable signal CKE from the outside and receives the address signal Add<7:10> from the address buffer 3. Based on these signals, the circuit 1a generates the refresh signal φREF, the refresh clock φREFCLK, the self-refresh signal φSREF, the activation signal φACT, a read signal φREAD, a write signal φWRITE, a precharge signal φPCG, the operation signal φNORMAL and a bank refresh signal φBANKREF.

Figure 2:
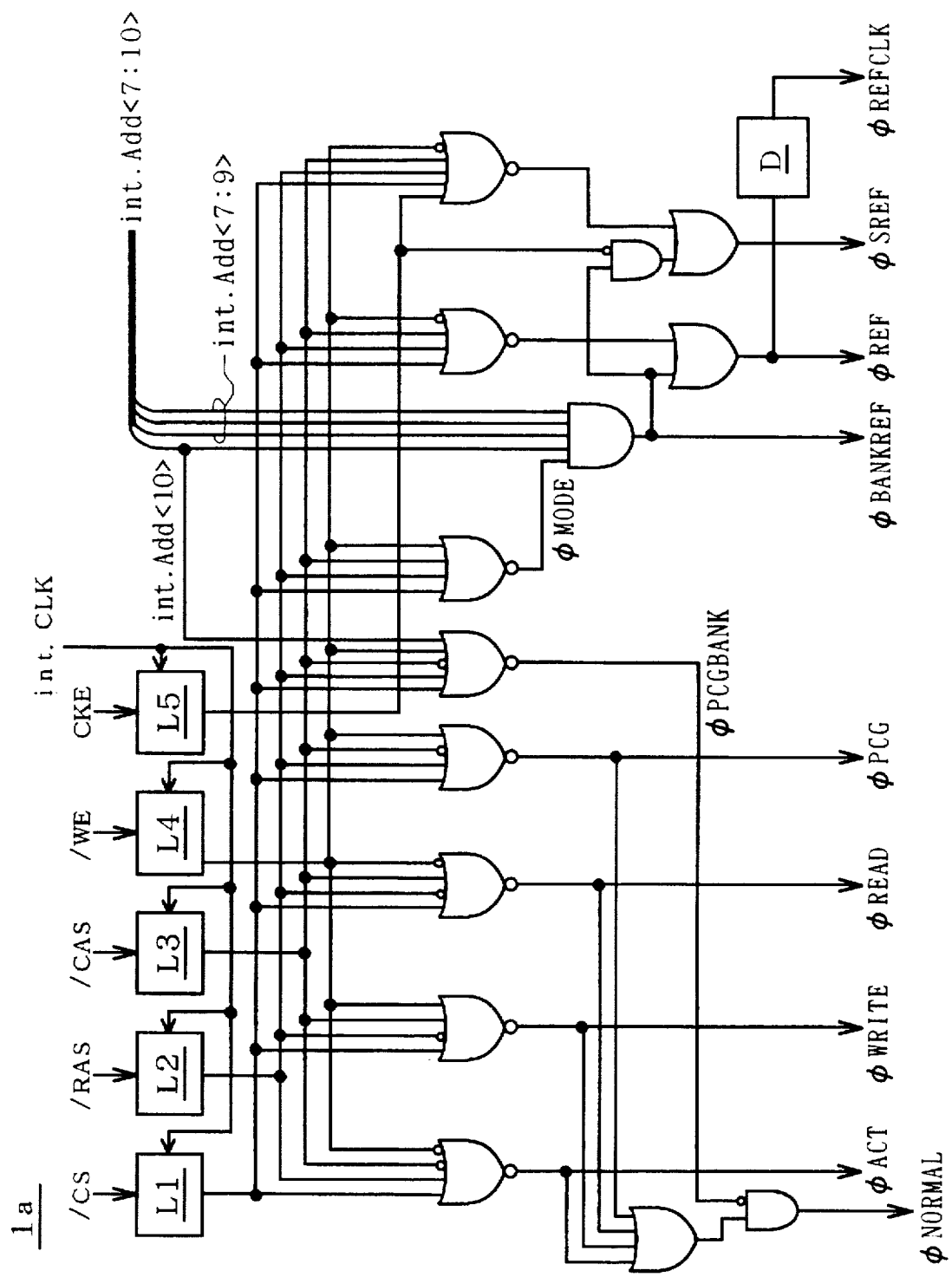
FIG. 2 is a circuit diagram showing an internal configuration of a circuit 1a of FIG. 1.
Figure 3:
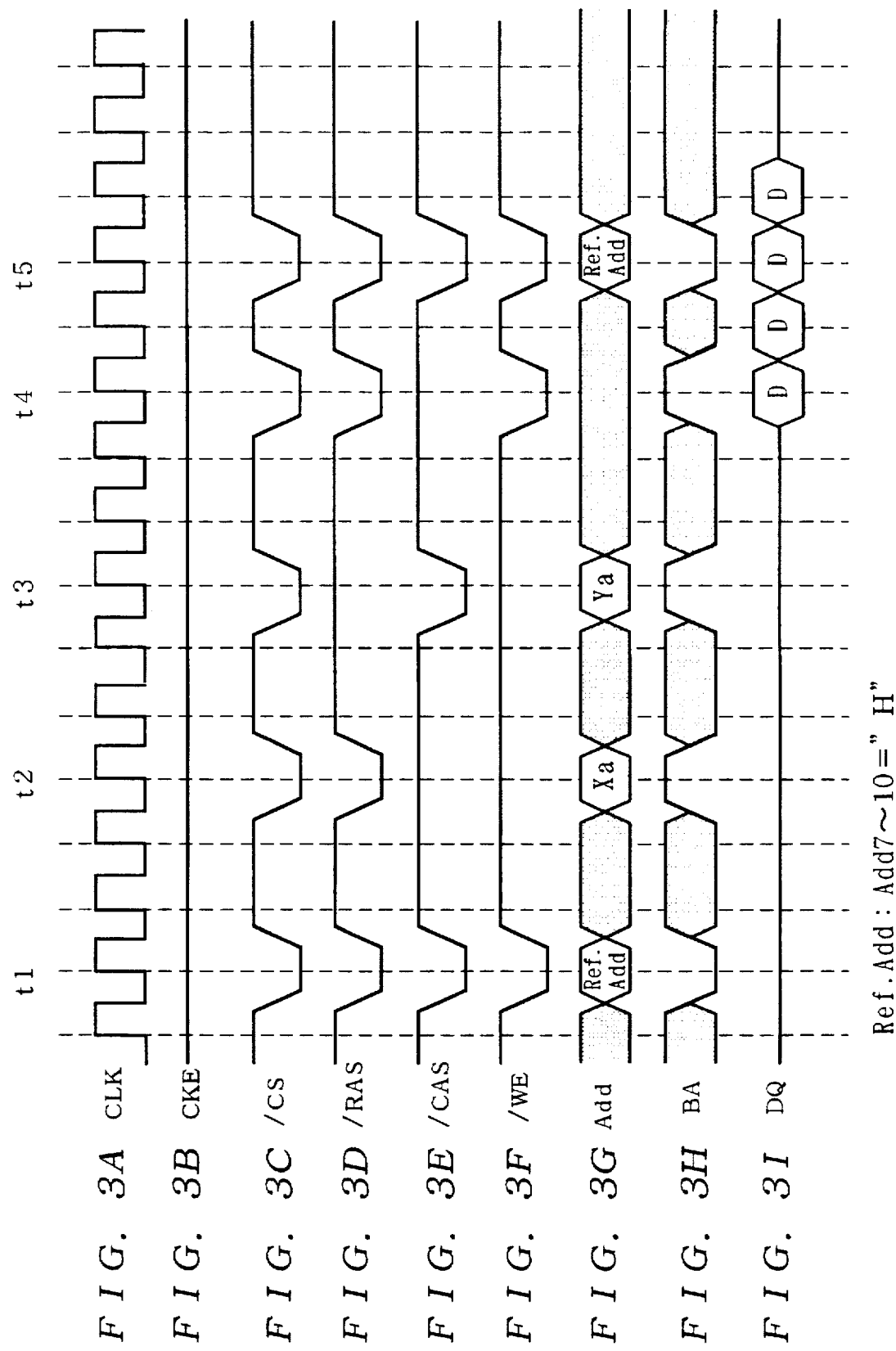
FIGS. 3A to 3I are timing charts of an operation in accordance with the first preferred embodiment of the present invention.

An internal configuration of the circuit 1a is shown in the circuit diagram of FIG. 2. Latches L1 to L5 buffer the chip select signal /CS, the row address strobe signal /RAS, the column address strobe signal /CAS, the write enable signal /WE and the clock enable signal CKE, respectively, based on the internal clock int.CLK The activation signal φACT becomes "H" to be activated when the chip select signal /CS is "L", the row address strobe signal /RAS is "L", the column address strobe signal /CAS is "H" and the write enable signal /WE is "H". The write signal φWRITE becomes "H" to be activated when the chip select signal /CS is "L", the row address strobe signal /RAS is "H", the column address strobe signal /CAS is "L" and the write enable signal /WE is "L". The read signal φREAD becomes "H" to be activated when the chip select signal /CS is "L", the row address strobe signal /RAS is "H", the column address strobe signal /CAS is "L" and the write enable signal /WE is "H". The precharge signal φPCG becomes "H" to be activated when the chip select signal /CS is "L", the row address strobe signal /RAS is "L", the column address strobe signal /CAS is "H" and the write enable signal /WE is "L". The operation signal φNORMAL becomes "H" to be activated when at least one of the activation signal φACT, the write signal φWRITE, the read signal φREAD and the precharge signal φPCG is activated, provided that a precharge bank set signal φPCGBANK is "L" being non-activated.

The precharge bank set signal φPCGBANK becomes "H" to be activated when the chip select signal /CS is "L", the row address strobe signal /RAS is "L", the column address strobe signal /CAS is "H", the write enable signal /WE is "L" and the address signal Add<10> is "L".

The bank refresh signal φBANKREF becomes "H" to be activated when the address signals Add<7> to<10> are all "H" and a mode signal a MODE is "H". The mode signal φMODE becomes "H" to be activated when all of the chip select signal /CS, the row address strobe signal /RAS, the column address strobe signal /CAS and the write enable signal /WE are "L" being activated.

Though the refresh signal φREF becomes "H" to be activated when the chip select signal /CS is "L", the row address strobe signal /RAS is "L", the column address strobe signal /CAS is "L" and the write enable signal /WE is "H" in the background art, it does in this preferred embodiment only if the bank refresh signal φBANKREF is "H", regardless of those control signals.

The self-refresh signal φSREF becomes "H" to be activated when the chip select signal /CS is "L", the row address strobe signal /RAS is "L", the column address strobe signal /CAS is "L", the write enable signal /WE is "H" and the clock enable signal CKE is "L" in the background art. Further in this preferred embodiment, it does also when the clock enable signal CKE is "L" and the bank refresh signal φBANKREF is "H".

Furthermore, the refresh clock φREFCLK is obtained by delaying the refresh signal φREF with a delay circuit D.

Referring back to FIG. 1, a memory-array control circuit 5 receives the activation signal φACT, the write signal φWRITE, the read signal φREAD and the precharge signal φPCG, and controls the memory array MEM based on these signals.

When the operation signal φNORMAL is activated, i.e., during a normal operation not a refresh operation, the internal address signal int.Add<0:10> from the address buffer 3 is supplied to the memory array MEM through a switch 17. The bank-address buffer 4 outputs the internal bank address int.BA to a node 14, and when the operation signal φNORMAL is activated, a switch 13a connects the node 14 to a node 15 to thereby supply the internal bank address int.BA to the memory array MEM.

On the other hand, when the operation signal φNORMAL is not activated and the bank refresh signal φBANKREF is activated, the switch 13a connects the node 14 to a node 16 and outputs the internal bank address int.BA as a refresh bank set signal φREFADD.

A switch 12 receives the refresh signal φREF, the bank refresh signal φBANKREF and the refresh bank set signal φREFADD, and supplies the refresh clock φREFCLK to either of refresh address counters 6a and 6b under the control as discussed later. A switch 11 also receives the refresh signal φREF, the bank refresh signal φBANKREF and the refresh bank set signal φREFADD, and supplies the memory array MEM with an output from either of the refresh address counters 6a and 6b that is supplied with the refresh clock φREFCLK, i.e., either a refresh address Ref.Add__A<0:10> or a refresh address Ref.Add__B<0:10>.

The first preferred embodiment, provided with refresh address counters corresponding to banks, is intended to allow access to data in a bank while the other bank is refreshed.

The self-refresh timer 7 receives the self-refresh signal φSREF, and the continuation signal φTIMER is activated when a predetermined time passes after the self-refresh signal φSREF is activated. The continuation signal φTIMER is supplied to the circuit 1a and the activation of the continuation signal φTIMER causes the refresh signal φREF and the self-refresh signal φSREF to be activated. These signals keep activated until the clock enable signal CKE becomes "H".

Figure 13:
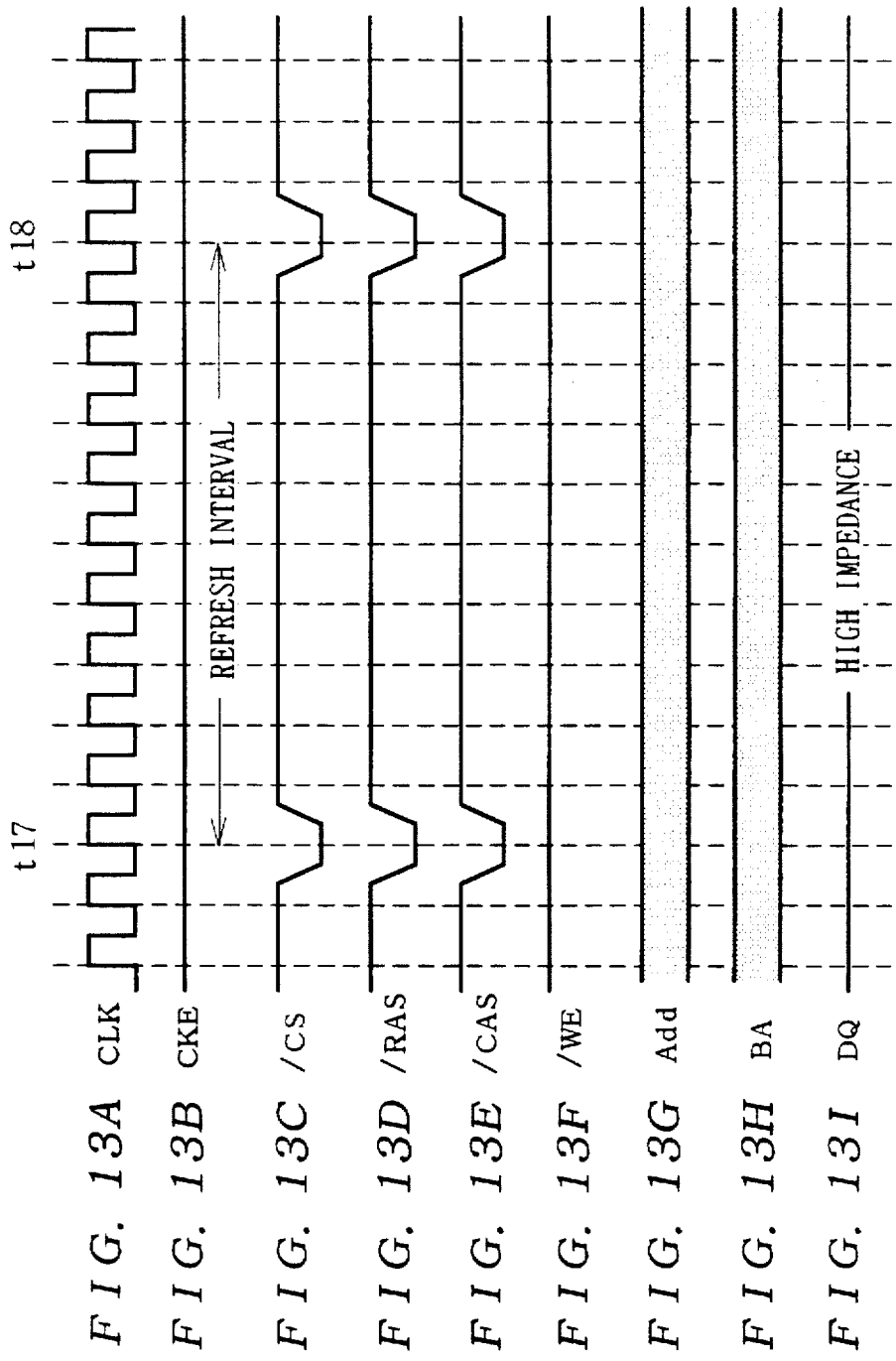

When the same auto-refresh operation as the background art is performed, an auto-refresh command is set with the control signals at time t17 of FIG. 13A, specifically, with the chip select signal /CS of "L", the row address strobe signal /RAS of "L", the column address strobe signal /CAS of "L", the write enable signal /WE of "H" and the clock enable signal CKE of "H". As is clear from FIG. 2, in this case, the refresh signal φREF becomes "H", and the refresh clock φREFCLK also becomes "H" after a predetermined time.

Further, as is also clear from FIG. 2, the bank refresh signal φBANKREF is "L" since the mode signal φMODE is "L", and the operation signal φNORMAL is "L". Accordingly, the switches 13 and 17 give no output. The self-refresh signal φSREF is non-activated.

On the other hand, the refresh signal φREF is inputted to the switches 11 and 12. If the bank refresh signal φBANKREF is non-activated, the switch 12 supplies the refresh clock φREFCLK alternately to the refresh address counters 6a and 6b every time the refresh signal φREF is activated, and the switch 11 outputs either of the outputs from the refresh address counters 6a and 6b every time the refresh signal φREF is activated. The switches 11 and 12 select in common one of the refresh address counters 6a and 6b.

In other words, the banks Bank0 and Bank1 are alternately selected every time the refresh signal φREF is activated and one of the refresh address counters 6a and 6b accordingly performs a count operation every time the refresh signal φREF is activated. As neither of the refresh address counters 6a and 6b includes a bank address counter, and the refresh clock φREFCLK is directly inputted to the address counter to be counted.

The updated refresh address Ref.Add__A<0:10> or Ref.Add__B<0:10> is supplied to the memory array MEM, instead of the internal address signal int.Add or the internal bank address int.BA. Moreover, since the refresh bank set signal φREFADD is also supplied to the memory array MEM, row addresses used for the refresh operation for the banks Bank0 and Bank1 is designated by the refresh addresses Ref.Add__A<0:10> and Ref.Add__B<0:10>, respectively. Then, a row of memory cells designated by the refresh address is refreshed.

Figure 17:
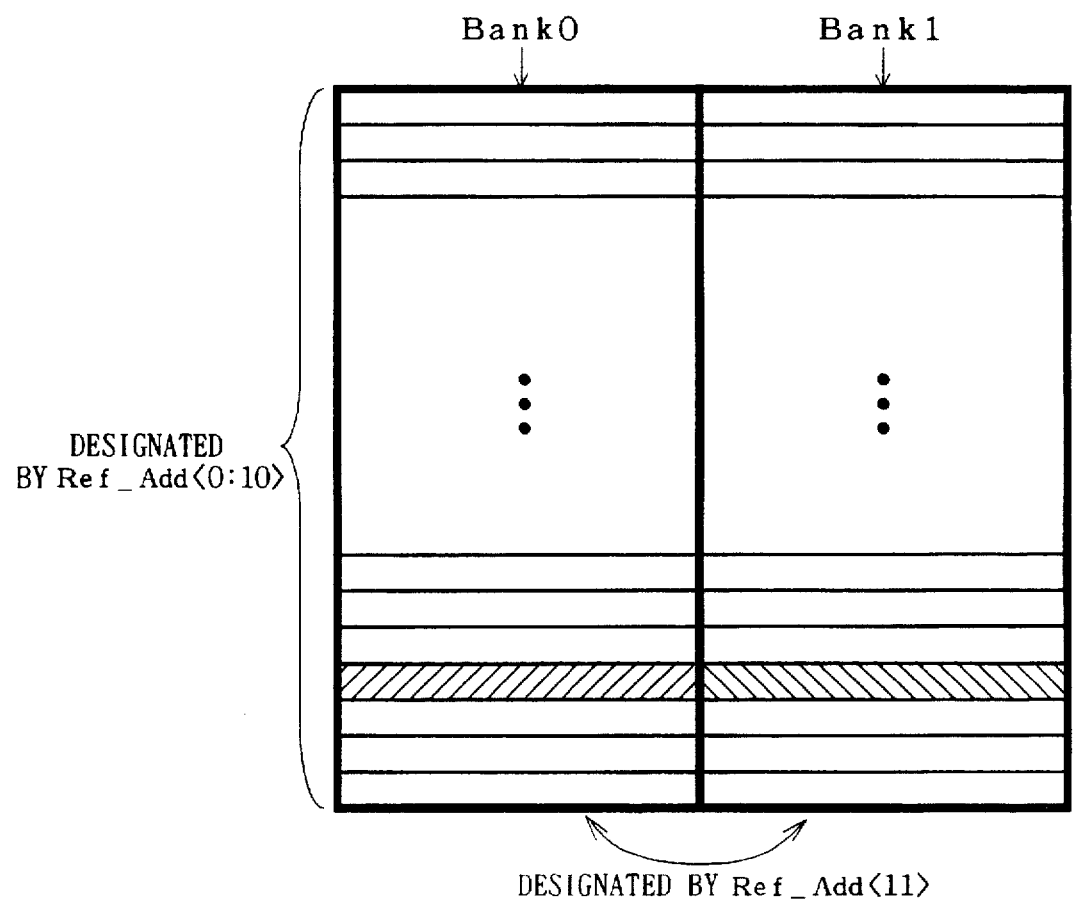
FIG. 17 is a conceptional diagram showing a self refresh in the background art.

The refresh clock φREFCLK is alternately supplied to the refresh address counters 6a and 6b corresponding to the banks Bank0 and Bank1 every time the auto-refresh command is inputted. Thus, the banks Bank0 and Bank1 are alternately refreshed, to achieve the auto-refresh operation as the background art shown in FIG. 17.

Figure 14:
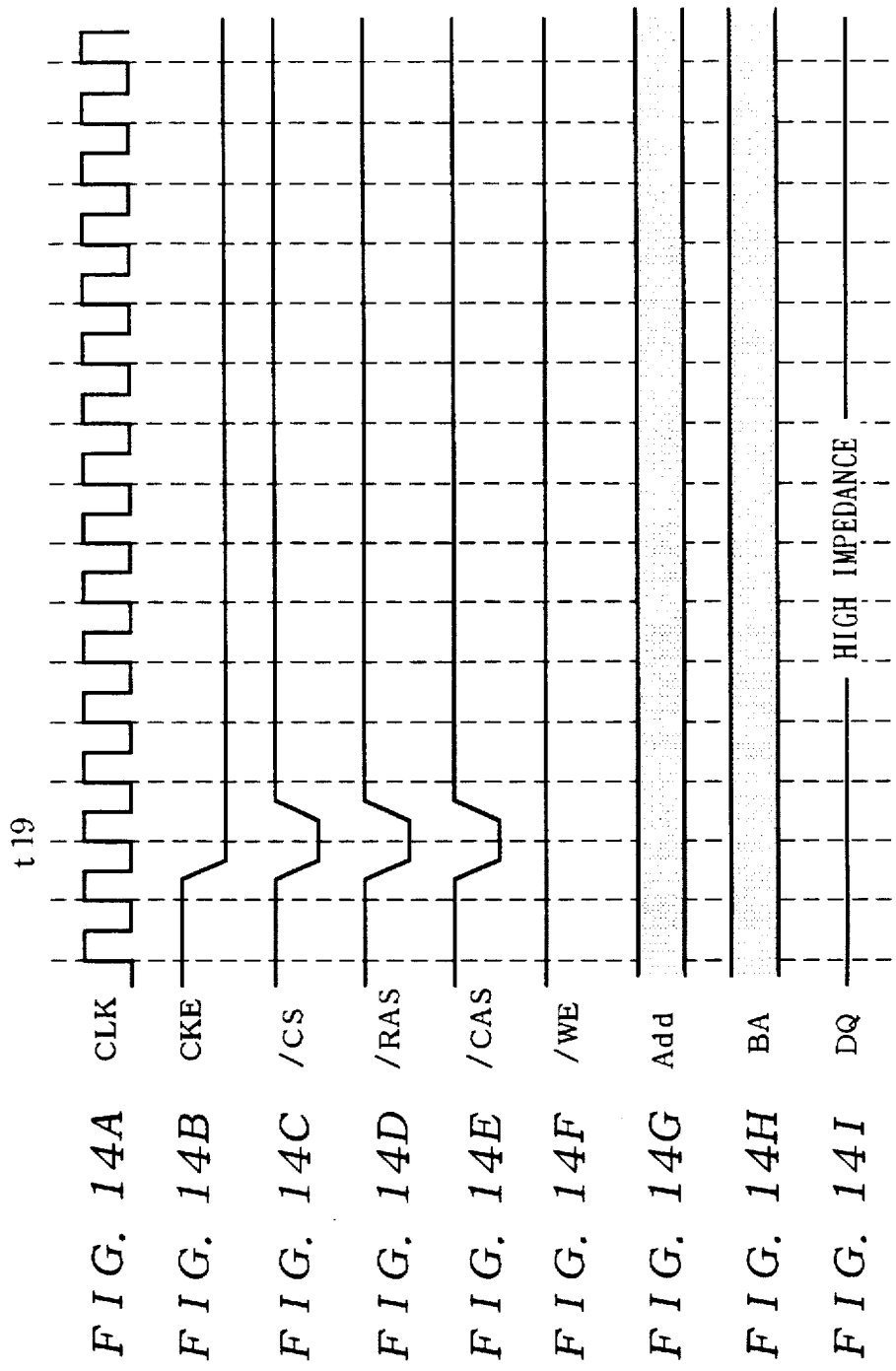
Figure 15:
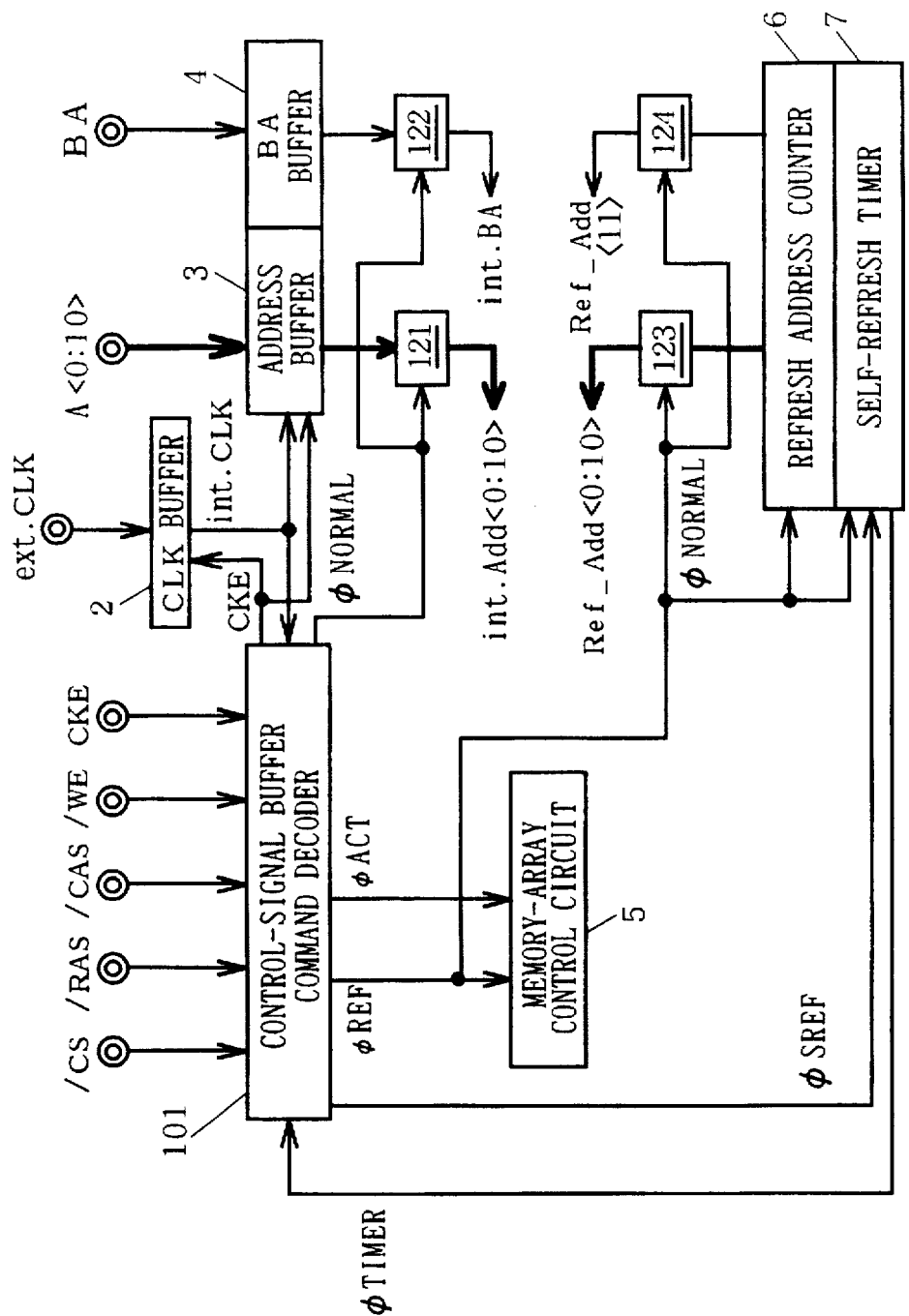
FIGS. 15 and 16 are block diagrams showing the background art.

When the same self-refresh operation as the background art is performed, a self-refresh command is set with the control signals at time t19 of FIG. 14A, specifically, with the chip select signal /CS of "L", the row address strobe signal /RAS of "L", the column address strobe signal /CAS of "L", the write enable signal /WE of "H" and the clock enable signal CKE of "L". In this case, the self-refresh signal φSREF as well as the refresh signal φREF is activated. Therefore, a row of memory cells in a bank are refreshed like the auto-refresh operation, and in addition, the self-refresh timer 7 activates the continuation signal φTIMER after a predetermined time.

The continuation signal φTIMER allows the refresh signal φREF and the self-refresh signal φSREF to continue being activated, and the next row of memory cells, in other words, a row of memory cells in the other bank are refreshed. Through repeating this operation, the banks Bank0 and Bank1 are alternately refreshed until a terminating command for self-refresh is inputted (the clock enable signal CKE becomes "H").

Now, a characteristic operation of the present invention, i.e., an operation for refreshing only one bank will be discussed. A command for auto-refreshing only one bank ("1-bank auto-refresh command") can be set with, for example, the following control signals: the chip select signal /CS of "L", the row address strobe signal /RAS of "L", the column address strobe signal /CAS of "L", the write enable signal /WE of "L", the clock enable signal CKE of "H" and the address signals Add <7> to<10> of "H". In this case, since the mode signal φMODE is activated, the bank refresh signal φBANKREF is activated and the refresh signal φREF is activated though the write enable signal /WE is "L", and so is the refresh clock φREFCLK.

The switch 13a connects the nodes 14 and 16 when the bank refresh signal φBANKREF is activated. Setting these control signals for the auto-refresh command is made in only one cycle as shown at time t17 of FIGS. 13A to 13F, and therefore, the bank refresh signal φBANKREF is activated only in one cycle where the auto-refresh command is inputted.

The switches 11 and 12 receive the bank refresh signal φBANKREF, and selects one of the refresh address counters 6a and 6b that is designated by the refresh bank set signal φREFADD when the bank refresh signal φBANKREF is activated.

Accordingly, when the 1-bank auto-refresh command is inputted, the internal bank address int.BA serves as the refresh bank set signal φREFADD to control the switch 12, and the refresh address counter 6a (or 6b) designated by the internal bank address int.BA performs a count in synchronization with the refresh clock φREFCLK The switch 11 outputs one of the refresh addresses Ref.Add__A<0:10> and Ref.Add__B<0:10> that is updated.

Then, a row of memory cells designated by the refresh address are refreshed. Thus, a bank to be refreshed can be designated by the bank refresh signal φBANKREF, instead of alternately refreshing the two banks Bank0 and Bank1 every time the auto-refresh command is inputted.

A command for self-refreshing only one bank ("1-bank self-refresh command") can be set with, for example, the following control signals: the chip select signal /CS of "L", the row address strobe signal /RAS of "L", the column address strobe signal /CAS of "L", the write enable signal /WE of "L", the clock enable signal of "L" and the address signals Add<7> to<10> of "H". In this case, since the clock enable signal is "L", the self-refresh signal φSREF is activated though the write enable signal /WE is "L", as well as the refresh signal φREF, the refresh clock φREFCLK and the bank refresh signal φBANKREF which are activated in auto-refreshing only one bank.

Therefore, a row of memory cells in a bank are refreshed like the 1-bank auto-refresh operation, and in addition, the self-refresh timer 7 receives the self-refresh signal φSREF and activates the continuation signal φTIMER after a predetermined time. The refresh bank set signal φREFADD keeps its value which is given at the input of the 1-bank self-refresh command until a terminating command for self-refresh is inputted (the clock enable signal CKE becomes "H"). Thus, the designated bank can be refreshed until the terminating command for self-refresh is inputted like the self-refresh in the background art.

A read of data in a bank during an auto-refresh operation for the other bank is shown in the timing charts of FIGS. 3A to 3I. At time t1, an auto-refresh command for the bank Bank0 designated by the bank address BA is inputted to start an auto-refresh operation only for the bank Bank0. On the other hand, the bank Bank1 is designated at time t2 and time t3, and the activation signal φ ACT and the read signal φREAD are activated, respectively. After the /CAS latency of e.g., three clock cycles, burst data (whose burst length is four in FIG. 3I) are outputted. At time t5, the next auto-refresh command is inputted to start the refresh operation for the bank Bank0.

In the first preferred embodiment, the bank refresh signal φBANKREF, which is new, is introduced and a plurality of refresh address counters are provided correspondingly to a plurality of banks, one of which is selected by the bank refresh signal φBANKREF. Therefore, access can be made to data in a bank while the other bank is refreshed, and the SDRAM of the present invention can be used like the SRAM which needs not be refreshed.

As the refresh signal φREF is also used, the same refresh operation as the background art can be achieved.

Naturally, designation of a bank to be refreshed can be achieved with activation/non-activation of other signals.

The Second Preferred Embodiment

Figure 4:
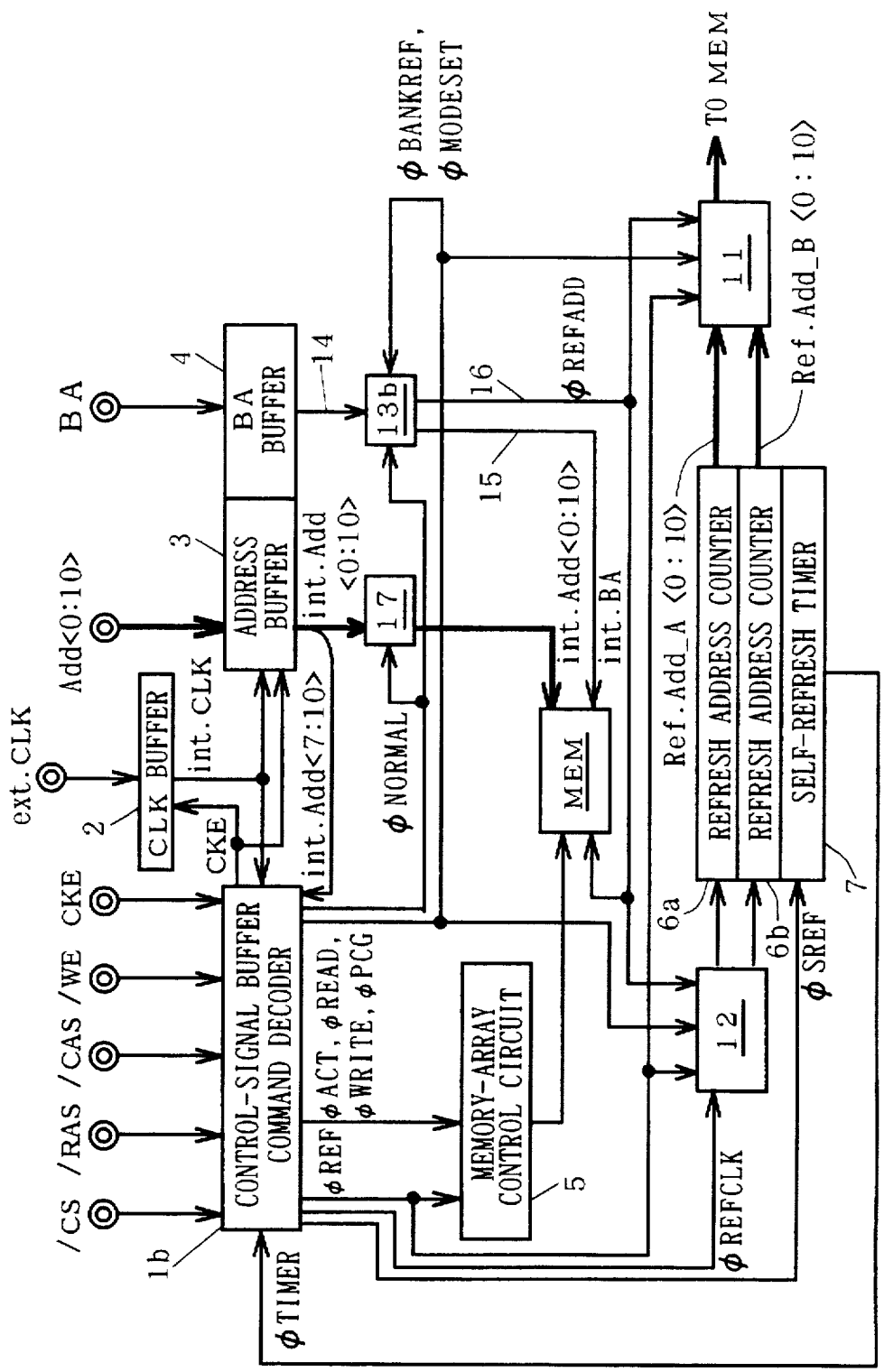
FIG. 4 is a block diagram showing a configuration of a control unit of an SDRAM in accordance with a second preferred embodiment of the present invention.

A configuration of a control unit of an SDRAM in accordance with the second preferred embodiment of the present invention is shown in the block diagram of FIG. 4. A difference between the first and second preferred embodiments in configuration is that the second preferred embodiment employs a circuit 1b and a switch 13b, instead of the circuit 1a and the switch 13a respectively.

Figure 5:
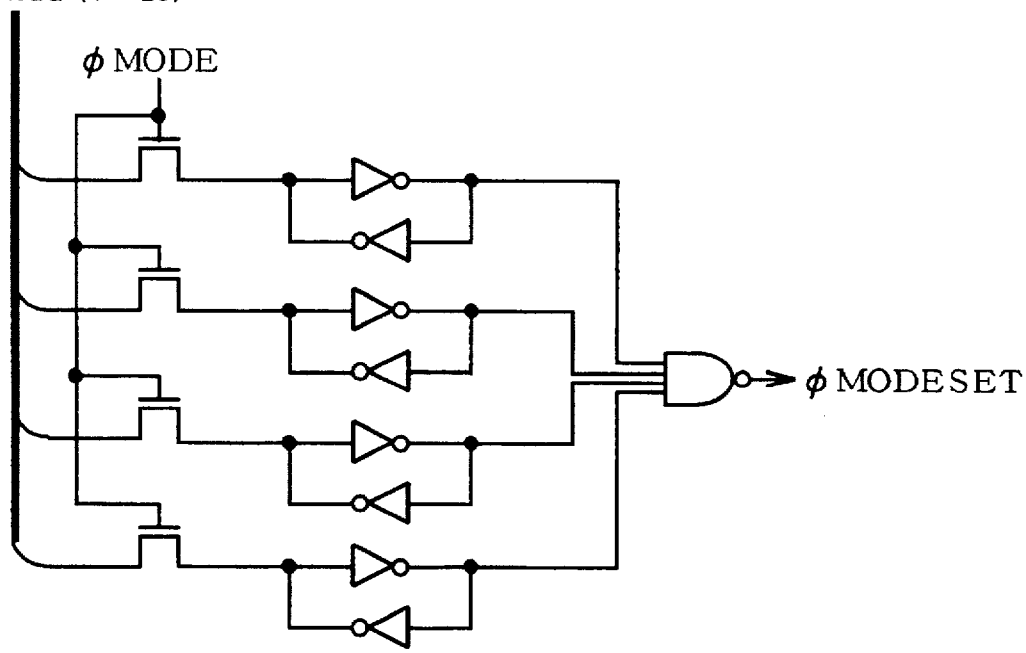
FIG. 5 is a circuit diagram showing a circuit part provided in addition to the circuit 1a of FIG. 1 to constitute a circuit 1b of FIG. 4.

A circuit part which is provided in addition to the circuit 1a to constitute a circuit 1b is shown in the circuit diagram of FIG. 5, and it receives the internal address signal int.Add<7:10> and the mode signal φMODE and outputs a mode set signal φMODESET. Naturally, the circuit shown in FIG. 5 may be provided as a mode set circuit separately from the circuit 1a of the first preferred embodiment.

As can be seen from FIG. 2, the mode signal φMODE is activated when the chip select signal /CS is "L", the row address strobe signal /RAS is "L", the column address strobe signal /CAS is "L" and the write enable signal /WE is "L". An inverse-parallel connection of a plurality of pairs of inverters of FIG. 5 holds the internal address signal int.Add<7:10>, and a NAND gate activates the mode set signal φMODESET to "H" when all of the internal address signals int.Add<7> to <10> are "L". With activation of the mode set signal φMODESET, the burst length, the burst sequence and the /CAS latency are determined by using the internal address signals int.Add<0:2>,<3> and<4:6>, respectively.

When only one bank is auto-refreshed or self-refreshed, designating the bank to be refreshed at the mode set, where the burst length, the burst sequence and the /CAS latency are determined, eliminates the needs for designating the bank address BA every time the auto-refresh or self-refresh command is inputted. In short, the second preferred embodiment is intended to further improve the first preferred embodiment, and specifically the bank to be refreshed is determined in advance, instead of designating it every time the command for refreshing only one bank ("1-bank refresh command") is inputted, to permits access to the other bank during the refresh operation for the designated bank.

Figure 6:
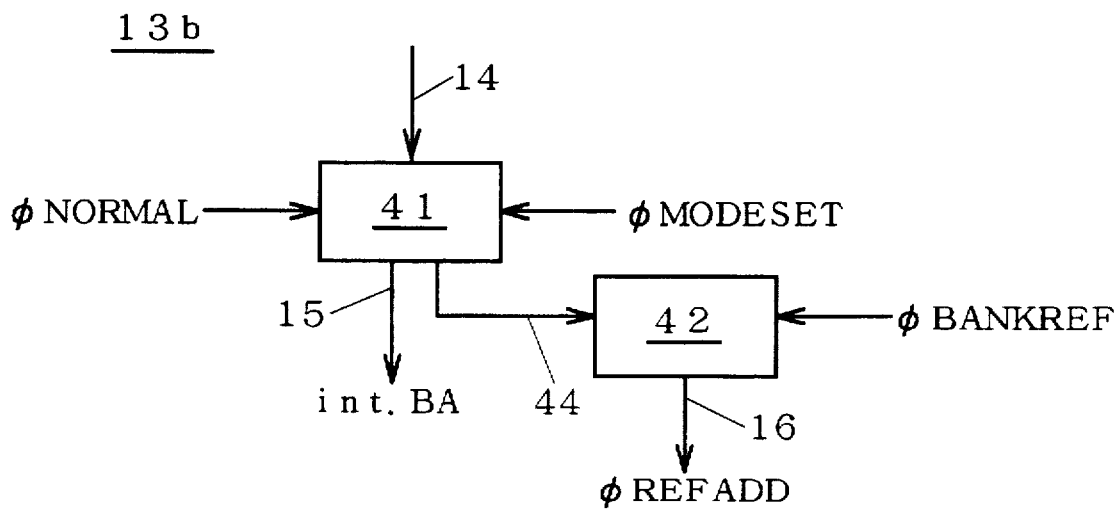
FIG. 6 is a circuit diagram showing a configuration of a switch 13b of FIG. 4.

A configuration of the switch 13b is shown in the circuit diagram of FIG. 6. The switch 13b includes a switch 41 and a latch circuit 42.

The switch 41 connects the nodes 14 and 15 to each other when the operation signal φNORMAL is activated. In this case, the switch 13b performs the same operation as the switch 13a of the first preferred embodiment. On the other hand, only if the mode set signal φMODESET is activated, the switch 41 connects the nodes 14 and 44 to each other. The latch circuit 42 latches a value given to the node 44 and supplies the value to the node 16 when the bank refresh signal φBANKREF is activated.

A command for mode set ("mode set command") can be set with the following control signals: the chip select signal /CS of "L", the row address strobe signal /RAS of "L", the column address strobe signal /CAS of "L" and the write enable signal /WE of "L". In accordance with the mode set command, the mode signal φMODE is activated in the circuit 1b. At this time, the mode set signal φMODESET is activated with the internal address signals int.Add<7> to<10> of "L", and the switch 41 supplies the node 44 with the internal bank address int.BA.

On the other hand, the mode set signal φMODESET keeps activated for only one cycle where the mode set command is inputted. Therefore, once the internal bank address int.BA is determined when the mode set command is inputted, the determined value of internal bank address int.BA is held by the latch circuit 42 until another mode set command is inputted.

After that, when a normal auto-refresh command or self-refresh command is inputted, neither the switch 41 nor the latch circuit 42 works since the bank refresh signal φBANKREF is "L" and the operation signal φNORMAL is also "L", and the operation like the first preferred embodiment is performed.

Now, a characteristic operation of the present invention, i.e., an operation for refreshing only one bank will be discussed. A 1-bank refresh command can be set with, for example, the following control signals: the chip select signal /CS of "L", the row address strobe signal /RAS of "L", the column address strobe signal /CAS of "L", the write enable signal IWE of "L", the address signals Add<7> to <10> of "H", and the clock enable signal of "H" if auto-refresh and of "L" if self-refresh.

Like the first preferred embodiment, the circuit 1b activates the refresh signal φREF, the refresh clock φREFCLK and the bank refresh signal φBANKREF, and in particular, further activates the self-refresh signal φSREF if self-refresh. Since the bank refresh signal φBANKREF is activated, data latched in the latch circuit 42, i.e., the bank address BA determined at the input of the mode set command is outputted as the refresh bank set signal φREFADD.

Thus, the second preferred embodiment can achieve the same effect as the first preferred embodiment, and further eliminates the need for designating the bank address BA every time the 1-bank refresh command is inputted.

The Third Preferred Embodiment

In an SDRAM consisting of two banks, for example, there is a case where access is made to data in a bank and the other bank is precharged. Then, when a 1-bank refresh command is inputted while one bank in the SDRAM is activated, selecting the other bank, being not-activated and precharged, to be refreshed would eliminate the need for designating the bank address thus achieving an effective refresh.

Figure 7:
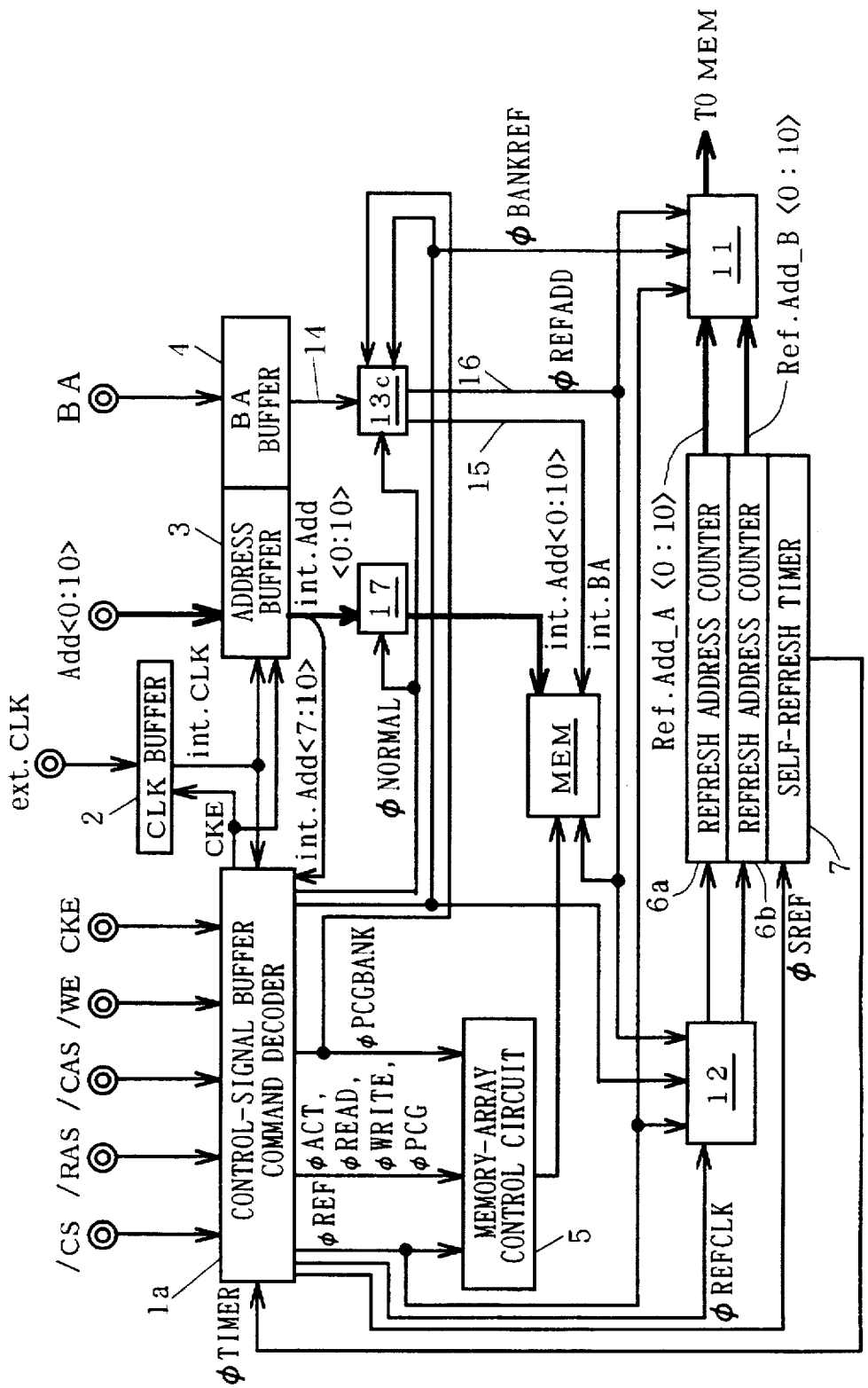
FIG. 7 is a block diagram showing a configuration of a control unit of an SDRAM in accordance with a third preferred embodiment of the present invention.

A configuration of a control unit of an SDRAM in accordance with the third preferred embodiment of the present invention is shown in the block diagram of FIG. 7. A difference between the first and third preferred embodiments in configuration is that the third preferred embodiment employs a switch 13c instead of the switch 13a. Further, a difference between the second and third preferred embodiments in the way of controlling the SDRAM is that the third preferred embodiment controls a switch with the precharge bank signal φPCGBANK, instead of controlling the switch 41 with the mode set signal φMODESET.

Figure 8:
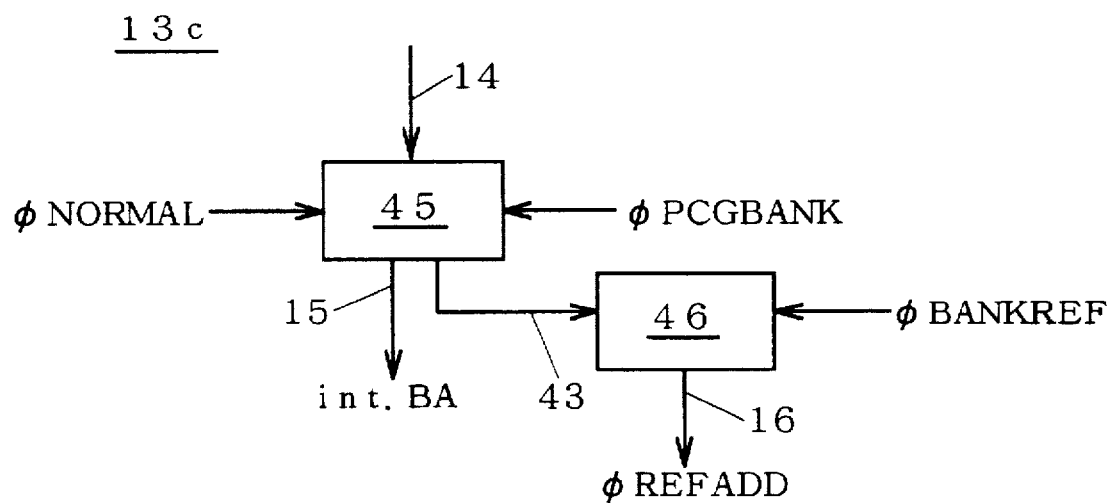
FIG. 8 is a circuit diagram showing a configuration of a switch 13c of FIG. 7.

A configuration of the switch 13c is shown in the circuit diagram of FIG. 8. The switch 13c includes a switch 45 and a latch circuit 46. The switch 45 connects the nodes 14 and 15 to each other when the operation signal φNORMAL is activated. In this case, the switch 13c performs the same operation as the switch 13a of the first preferred embodiment. On the other hand, only if the precharge bank signal φPCGBANK supplied from the circuit 1a is activated, the switch 45 connects the nodes 14 and 43 to each other. The latch circuit 46 latches a value given to the node 43 and outputs the value to the node 16 with activation of the bank refresh signal φBANKREF.

When a bank is precharged, the precharge signal φPCG supplied from the circuit 1a is activated. In order to select the bank to be precharged for refresh, the bank address BA at the input of a precharge command is latched. Receiving the precharge signal φPCG, the memory-array control circuit 5 controls the memory array MEM.

The precharge bank signal φPCGBANK permits determination of the bank to be precharged. In the configuration of FIG. 2, a 1-bank precharge command is set with the control signals for activating the precharge signal φPCG (i.e., the chip select signal /CS of "L", the row address strobe signal /RAS of "L", the column address strobe signal /CAS of "H" and the write enable signal /WE of "L") and the internal address signal int.Add<10> of "L", to activate the precharge banksignal φPCGBANK.

On the other hand, the precharge bank signal φPCGBANK keeps activated for only one cycle where the 1-bank precharge command is inputted. Therefore, once the internal bank address int.BA is determined when the 1-bank precharge command is inputted, the determined value of the internal bank address int.BA is held by the latch circuit 46 until another 1-bank precharge command is inputted.

If the internal address signal int.Add<10> is "H", the operation signal φNORMAL is activated even if the precharge signal φPCG is activated by setting the control signals as above, and if the internal address signal int.Add<10> is "L", the operation signal φNORMAL is non-activated. Thus, for precharge, making the internal address signal int.Add<10> "H" or "L" causes the switch 45 to output the bank address BA to the node 15 or 43.

After that, when a normal auto-refresh command or self-refresh command is inputted, the two banks are alternately refreshed like in the first and second preferred embodiments.

Now, a characteristic operation of the present invention, i.e., an operation for refreshing only one bank will be discussed. A 1-bank refresh command can be set with, for example, the following control signals: the chip select signal /CS of "L", the row address strobe signal /RAS of "L", the column address strobe signal /CAS of "L", the write enable signal /WE of "L", the address signals Add<7> to <10> of "H", and the clock enable signal CKE of "H" if auto-refresh and of "L" if self-refresh. Like the first preferred embodiment, the circuit 1a activates the refresh signal φREF, the refresh clock φREFCLK and the bank refresh signal φBANKREF, and in particular, further activates the self-refresh signal φSREF if self-refresh. Since the bank refresh signal φBANKREF is activated, data latched in the latch circuit 46, i.e., the bank address BA determined at the input of the 1-bank precharge command is outputted as the refresh bank set signal φREFADD.

Thus, in the third preferred embodiment, at the input of the command for refreshing only one bank, the not-activated bank, instead of the bank to be refreshed, is selected for refresh. Therefore, the third preferred embodiment can achieve the same effect as the first preferred embodiment, and further eliminates the need for designating the bank address by selecting the bank precharged at the input of the 1-bank refresh command.

The Fourth Preferred Embodiment

As discussed above, in the first to third preferred embodiments provided are as much refresh address counters as banks constituting the SDRAM. For example, a configuration of the SDRAM consisting of four banks, provided with as much the refresh address counters, would cause increased area of layout and complicate control over signals.

Then, if the SDRAM consists of 2 N (N≦2) banks, only two refresh address counters are provided, instead of as much refresh counters as banks provided independently. The banks are classified into two groups in accordance with the most significant bit of the bank address and either of the two groups each consisting of N banks is refreshed. During a refresh operation for one group of N banks, access can be made to the other group of N banks.

Figure 9:
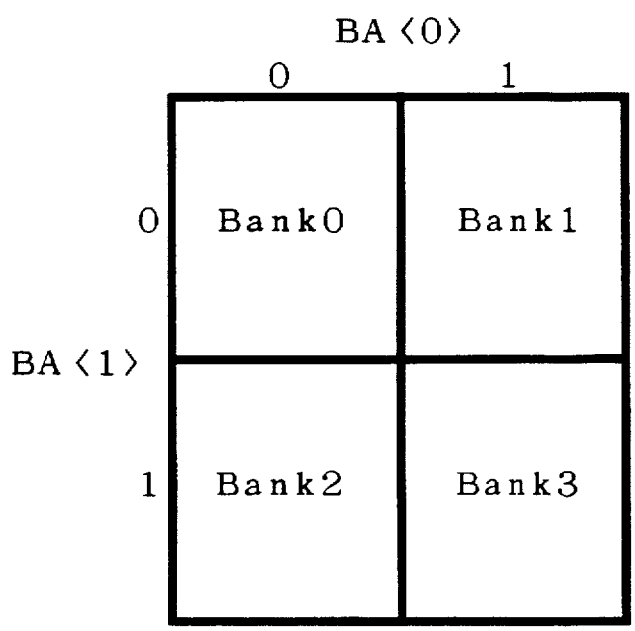
FIG. 9 is a conceptional diagram showing designation of bank in an SDRAM consisting of four banks using a 2-bit bank address.

Designation of four banks, Bank0, Bank1, Bank2 and Bank3, constituting an SDRAM by 2-bit bank address BA<0:1> is shown in the conceptional diagram of FIG. 9. In accordance with the higher bit BA<1> of the bank address BA of "0" or "1", the first group of banks, Bank0 and Bank1, or the second group of banks, Bank2 and Bank3, is designated.

A refresh address counter is provided correspondingly to each of the first and second groups of banks. That suppresses an increase in area of the layout and simplifies a signal control. Thus, during a refresh operation for one group of banks, access can be made to the two banks of the other group.

Figure 10:
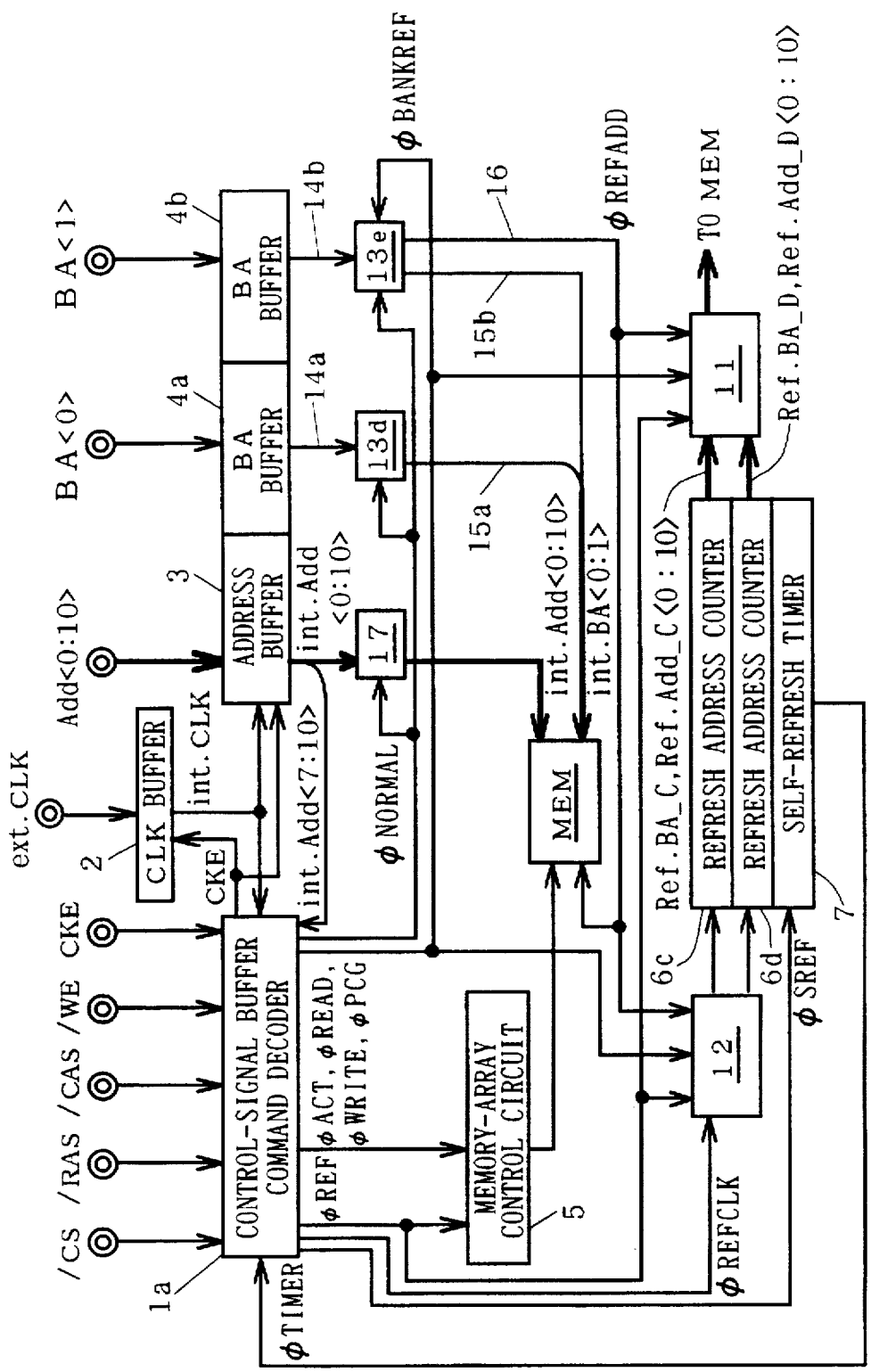
FIG. 10 is a block diagram showing a configuration of a control unit of an SDRAM in accordance with a fourth preferred embodiment of the present invention.

A configuration of a control unit of an SDRAM in accordance with the fourth preferred embodiment of the present invention is shown in the block diagram of FIG. 10. A difference between the first and fourth preferred embodiments in configuration is that the fourth preferred embodiment employs a pair of bank-address buffers 4a and 4b instead of the bank-address buffer 4, switches 13d and 13e corresponding to the address buffers 4a and 4b, respectively, instead of the switch 13a and refresh address counters 6c and 6d instead of the refresh address counters 6a and 6b. The memory array consists of four banks as shown in FIG. 9.

The refresh address counter 6c outputs refresh addresses designating memory cells in the two banks Bank0 and Bank1 of the first group and the refresh address counter 6d outputs refresh addresses designating memory cells in the two banks Bank2 and Bank3 of the second group.

Figure 16:
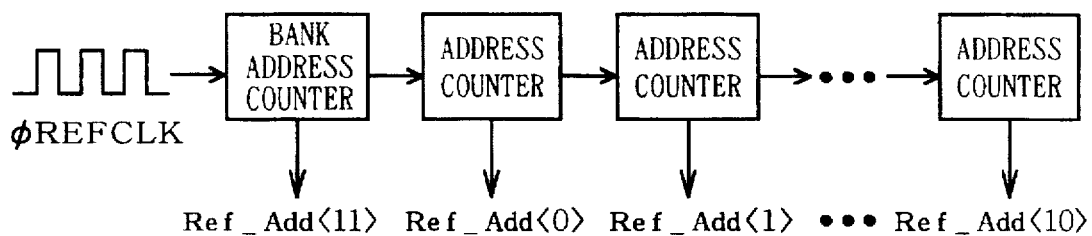

The refresh address counters 6c and 6d each include a bank-address counter and address counters connected in series as shown in FIG. 16. The bank-address counter receives the refresh clock φREFCLK and generates a refresh address like in the background art. Therefore, counting is performed so that the two banks Bank0 and Bank1 may be alternately refreshed in the first group and the two banks Bank2 and Bank3 may be alternately refreshed in the second group.

The switch 13d works like the switch 17. The bank address BA<0> supplied to the bank-address buffer 4a is given to a node 14a as an internal bank address int.BA<0>, and if the operation signal φNORMAL is activated, the internal bank address int.BA<0> is propagated to a node 15a.

The switch 13e works like the switch 13a of the first preferred embodiment. The bank address BA<1> supplied to the bank-address buffer 4b is given to a node 14b as an internal bank address int.BA<1>, and if the operation signal φNORMAL is activated, the internal bank address int.BA<1> is propagated to a node 15b. Further, if the bank refresh signal φBANKREF is activated, the internal bank address int.BA<1>is propagated to a node 16 as the refresh bank set signal φREFADD.

If the operation signal φNORMAL is activated, the internal bank address int.BA<0:1> is supplied to the memory array MEM, along with the internal address int.Add<0:10>, designating a row in one of the four banks.

When a normal auto-refresh command is inputted, the refresh signal φREF and the refresh clock φREFCLK are activated. Like the first preferred embodiment, either of the refresh address counters 6c and 6d is selected and its outputs, a refresh row signal Ref.Add_C<0:10> and a refresh bank signal Ref.BA_C or a refresh row signal Ref.Add_D<0:10> and a refresh bank signal Ref.BA_D, are given to the memory array MEM. The refresh bank signals Ref.BA_C and Ref.BA_D designate a bank to be refreshed in the first group and the second group, respectively, each of which corresponds to the refresh bank signal Ref.Add<11> in the background art. Thus, a row of memory cells in the designated bank is refreshed.

Every time the refresh signal φREF is activated, the switches 11 and 12 alternately select one of the refresh address counters 6c and 6d and the selected refresh address counter performs a count in accordance with the refresh clock φREFCLK Since the refresh bank signals Ref BA_C and Ref.BA_D transit every counting, the four banks are selected in the order of Bank0, Bank2, Bank1 and Bank3.

When a normal self-refresh command is inputted, the self-refresh signal φSREF is activated as well as the refresh signal φREF and the refresh clock φREFCLK. Like the normal auto-refresh operation, one of the four banks is selected and a row of memory cells in the selected bank start being refreshed. Based on the activation of the self-refresh signal φSREF, the continuation signal φTIMER is activated by the self-refresh timer 7 and the refresh signal φREF, the refresh clock φ REFCLK and the self-refresh signal φSREF keep activated, to repeat sequential selection of one of the four banks and a refresh for a row of memory cells in the selected bank, until the terminating command for self-refresh is inputted.

Now, a characteristic operation of the present invention, i.e., an operation for refreshing only two banks in one group will be discussed. A command for auto-refreshing only two banks in one group ("2-bank auto-refresh command") can be set with, for example, the following control signals: the chip select signal /CS of "L", the row address strobe signal /RAS of "L", the column address strobe signal /CAS of "L", the write enable signal /WE of "L", the clock enable signal CKE of "H" and the address signals Add<7>to<10> of "H". At this time, a value of the bank address BA<1> is determined.

When the 2-bank auto-refresh command is inputted, the bank refresh signal φBANKREF is activated as well as the refresh signal φREF and the refresh clock φREFCLK outputted from the circuit 1a. Accordingly, the value of the bank address BA<1> is adopted as the refresh bank set signal φREFADD to control the switches 11 and 12.

If the bank refresh signal φBANKREF is activated, the switches 11 and select one of the refresh address counters 6c and 6d in accordance with the value of the refresh bank set signal φREFADD.

However, the bank refresh signal φBANKREF keeps activated for only one cycle where the 2-bank auto-refresh command is inputted, and the refresh signal φREF and the refresh clock φREFCLK also keep activated for only this one cycle to cause either of the refresh address counters 6c and 6d to count. Therefore, fixing the value of the bank address BA<1> determined at the input of the 2-bank auto-refresh command allows alternate refresh for the two banks in one group while making access to the two banks in the other group, instead of sequentially selecting one of the four banks to be refreshed.

A command for self-refreshing only two banks in one group ("2-bank self-refresh command") can be set with, for example, the following control signals: the chip select signal /CS of "L", the row address strobe signal /RAS of "L", the column address strobe signal /CAS of "L", the write enable signal /WE of "L", the clock enable signal CKE of "L" and the address signals Add<7> to<10> of "H". At this time, a value of the bank address BA<1> is determined.

When the 2-bank self-refresh command is inputted, the self-refresh signal φSREF is activated in addition to those signals which are activated when the 2-bank auto-refresh command is inputted. Like the auto-refresh operation, a row of memory cells in the designated bank are refreshed. The refresh operation is repeated by the continuation signal TIMER. Until the terminating command for self-refresh is inputted, as the refresh bank set signal φREFADD at the input of the 2-bank self-refresh command is effective, the two banks in one group are alternately refreshed.

Thus, the fourth preferred embodiment allows alternate refresh operation for a plurality of banks in one of the two groups like the background art while making access to the other group of banks. Moreover, the fourth preferred embodiment can reduce the area of chip as compared with a configuration employing as much refresh address counters as banks as shown in the first preferred embodiment.

The Fifth Preferred Embodiment

It has been shown that the first to fourth preferred embodiments allows a refresh for a bank while making access to another bank. However, making access to a bank being refreshed interferes with proper refresh and proper read/write of data. If access is made to a bank being refreshed, it is desirable that the access should be disabled. For this purpose, the fifth preferred embodiment supplies the memory-array control circuit 5 with a busy signal to ignore the activation signal φACT that the memory-array control circuit 5 receives.

Figure 11:
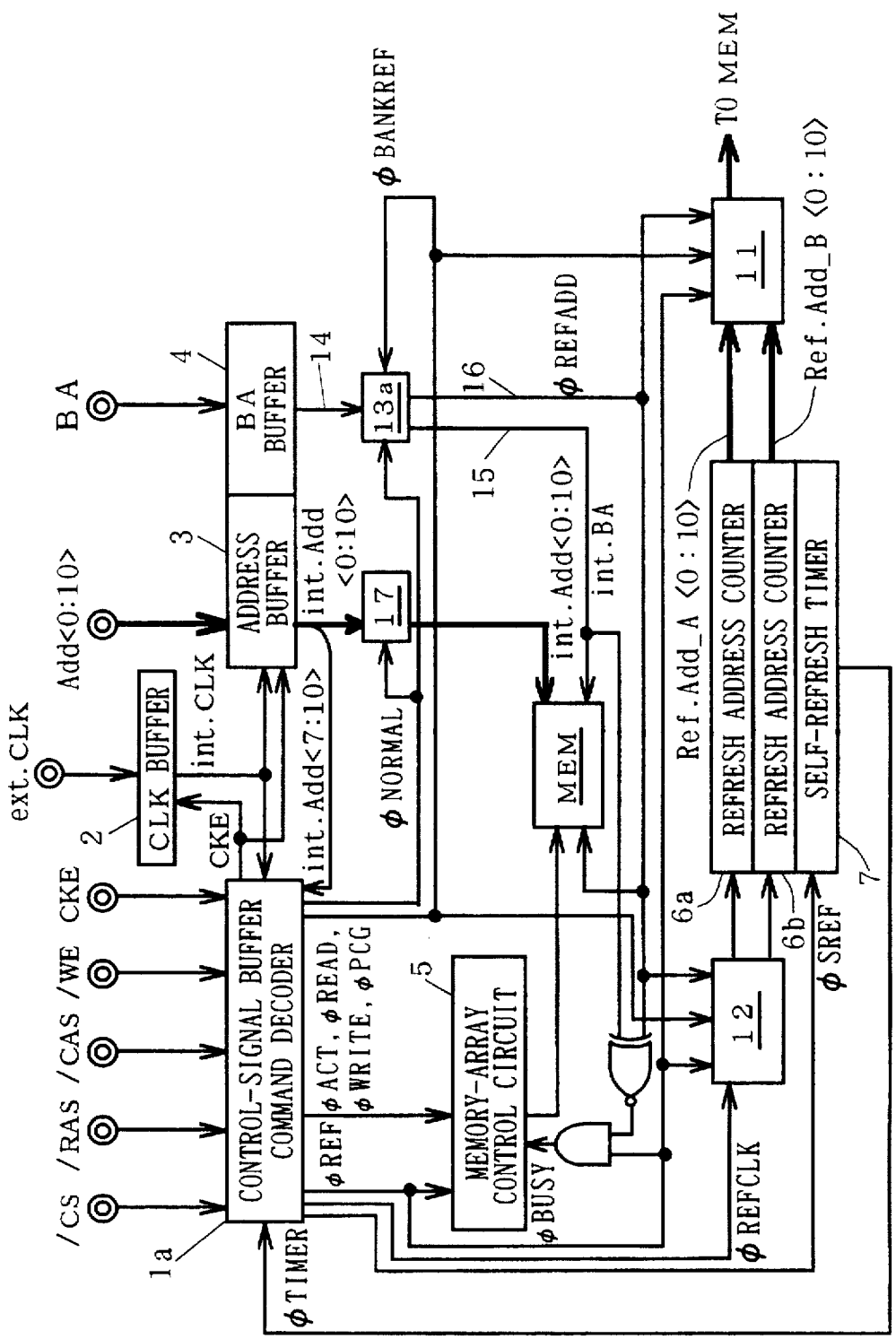
FIG. 11 is a block diagram showing a configuration of a control unit of an SDRAM in accordance with a fifth preferred embodiment of the present invention.
Figure 12:
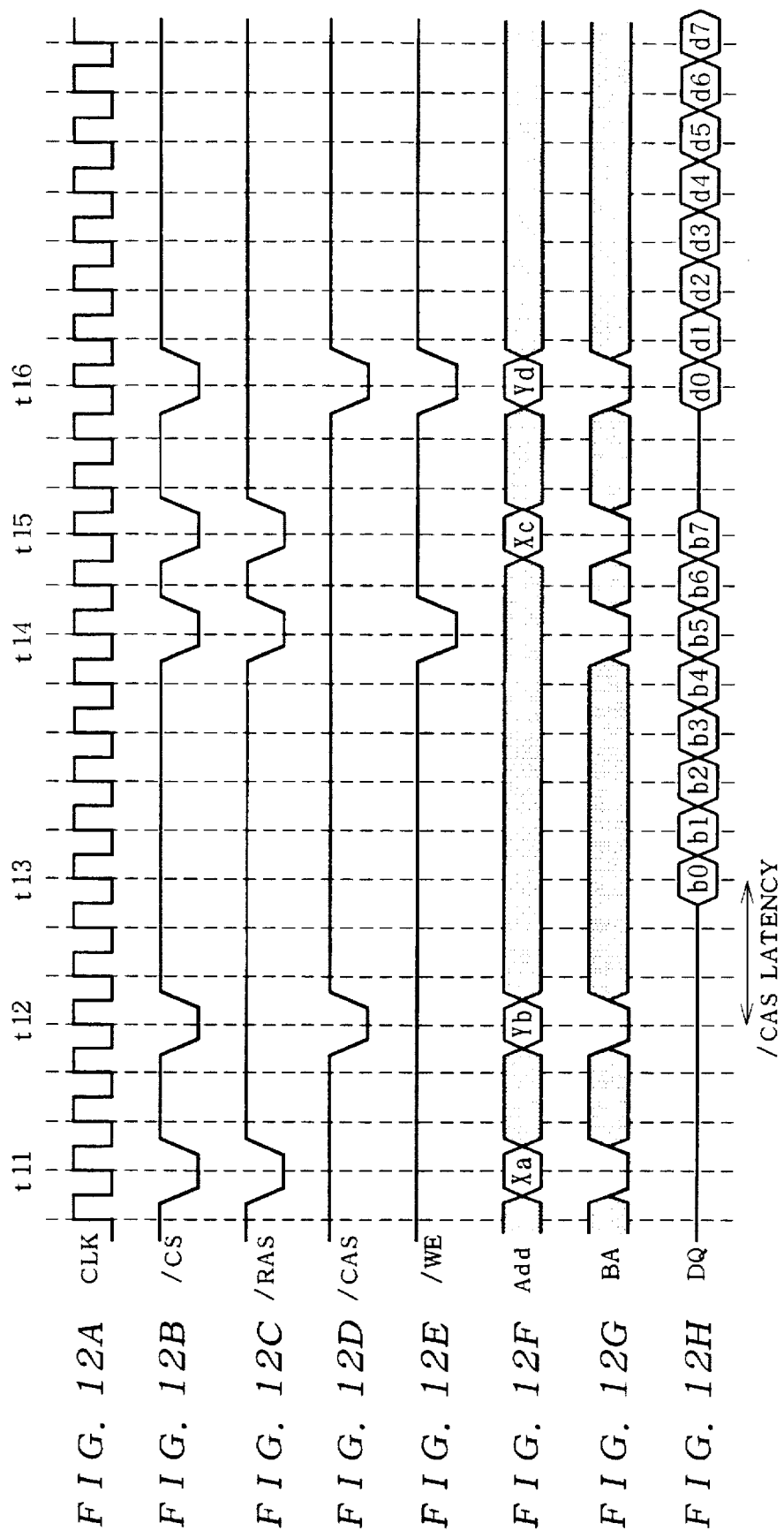
FIGS. 12A to 12H, 13A to 13I and 14A to 14I are timing charts showing the background art.

A configuration of a control unit of an SDRAM in accordance with the fifth preferred embodiment of the present invention is shown in the block diagram of FIG. 11. This preferred embodiment can apply to any of the first to fourth preferred embodiments, and FIG. 11 illustrates this preferred embodiment applied to the SDRAM of the first preferred embodiment.

As discussed earlier, when the 1-bank refresh command is inputted, a bank to be refreshed is determined by the refresh bank set signal φREFADD. After that, if access is made to the bank being refreshed, the activation signal φACT is activated and the memory-array control circuit 5 should activate the bank being refreshed based on the internal bank address int.BA having the same value as the refresh bank set signal φREFADD.

That would interfere with the refresh operation and further with proper read/write operation. For this reason, an Ex-NOR gate and an AND gate are provided to generate a busy signal φBUSY which is activated when the refresh bank set signal φREFADD and the internal bank address int.BA (int.BA<1> when applied to the fourth preferred embodiment) designate the same bank address during the refresh operation, in other words, while the refresh signal φREF is activated.

The memory-array control circuit 5 receives the busy signal φBUSY, and ignores the activation signal φACT if the busy signal φBUSY is activated. That ensures a proper refresh operation even if only one bank is refreshed and the bank being refreshed is accessed.

Naturally, by outputting the busy signal φBUSY outside, it is possible to notice that access is failed though the activation signal φACT is activated.

While the invention has been shown and described in detail, the foregoing description is in all aspects illustrative and not restrictive. It is therefore understood that numerous modifications and variations can be devised without departing from the scope of the invention.

We claim:

1. A synchronous semiconductor memory device, comprising:
   a memory array including a plurality of bank groups each consisting of at least one bank,
   said synchronous semiconductor memory device, further comprising:
   (a) refresh address counters provided correspondingly to said plurality of bank groups;
   (b) a first switch receiving a first signal which is activated to indicate a refresh operation and a second signal which is activated to indicate a special refresh operation included in said refresh operation, and supplying a refresh clock to one of said refresh address counters by
   (b-1) changing a connection every time said first signal is activated when said second signal is not activated, or
   (b-2) determining said connection in accordance with a bank address for externally designating one of said plurality of bank groups when said second signal is activated, and
   (c) a second switch adopting an output from said one of said refresh address counters which is supplied with said refresh clock as a refresh address to be used for refreshing said memory array.

2. The synchronous semiconductor memory device of claim 1, wherein
   said at least one bank is a bank, and
   said bank address is a 1-bit address.

3. The synchronous semiconductor memory device of claim 1, further comprising:
   (d) a self-refresh timer for activating a continuation signal when a predetermined time passes after activation of a self-refresh signal indicating a self-refresh, wherein said continuation signal activates said first signal and said self-refresh signal.

4. The synchronous semiconductor memory device of claim 1, wherein
   said second signal is activated by giving a predetermined logic to part of an address for said memory array when a row address strobe signal, a column address strobe signal and a write enable signal for said memory array are all non-activated.

5. The synchronous semiconductor memory device of claim 1, wherein
   said refresh clock is obtained by delaying said first signal.

6. The synchronous semiconductor memory device of claim 1, further comprising:
   (d) a logic circuit for generating a busy signal to be used for ignoring an access request which is issued to one of said plurality of bank groups being refreshed during said special refresh operation.

7. The synchronous semiconductor memory device of claim 1, further comprising:
   (d) a latch circuit for latching said bank address at a mode set operation for defining an input/output operation on said memory array and outputting said bank address which is latched therein when said second signal is activated.

8. The synchronous semiconductor memory device of claim 7, wherein
   (e) a logic circuit for generating a busy signal to be used for ignoring an access request which is issued to one of said plurality of bank groups being refreshed during said special refresh operation.

9. The synchronous semiconductor memory device of claim 1, further comprising:

(d) a latch circuit for latching said bank address of said bank to be precharged and outputting said bank address which is latched therein when said second signal is activated.

10. The synchronous semiconductor memory device of claim 9, wherein (e) a logic circuit for generating a busy signal to be used for ignoring an access request which is issued to one of said plurality of bank groups being refreshed during said special refresh operation.

11. The synchronous semiconductor memory device of claim 1, wherein said at least one bank is a plurality of banks, and said bank address is the most significant bit of a plurality of bits designating one of said plurality of banks.

12. The synchronous semiconductor memory device of claim 11, wherein each of said refresh address counters outputs a second bank address designating one of said plurality of banks constituting one of said plurality of bank groups corresponding thereto.

13. The synchronous semiconductor memory device of claim 11, wherein (e) a logic circuit for generating a busy signal to be used for ignoring an access request which is issued to one of said plurality of bank groups being refreshed during said special refresh operation.

\* \* \* \* \*